US010256391B2

(12) United States Patent
Gooth et al.

(10) Patent No.: US 10,256,391 B2
(45) Date of Patent: Apr. 9, 2019

(54) THERMOELECTRIC DEVICE

(71) Applicant: International Business Machines Corporation, Armonk, NY (US)

(72) Inventors: Johannes Gooth, Horgen (CH); Bernd Gotsmann, Horgen (CH); Fabian Menges, Urdorf (CH)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 15/686,377

(22) Filed: Aug. 25, 2017

(65) Prior Publication Data
US 2019/0067547 A1 Feb. 28, 2019

(51) Int. Cl.
*H01L 35/32* (2006.01)
*H01L 35/18* (2006.01)
*H01L 35/14* (2006.01)

(52) U.S. Cl.
CPC ............ *H01L 35/32* (2013.01); *H01L 35/14* (2013.01); *H01L 35/18* (2013.01)

(58) Field of Classification Search
USPC .................................................. 136/200–242
See application file for complete search history.

(56) References Cited

U.S. PATENT DOCUMENTS

2011/0088739 A1* 4/2011 Zinn ...................... B82Y 30/00
136/205

OTHER PUBLICATIONS

Hirschberger et al., The chiral anomaly and thermopower of Weyl fermions in the half-Heusler GdPtBi, 2016, Nature Materials 15, 1161-1165 (Year: 2016).*
Shuang Jia, Su-Yang Xu and M. Zahid Hasan Weyl, "Weyl semimetals, Fermi arcs and chiral anomalies", 1140 Nature Materials, vol. 15, Nov. 2016.
Thermoelectric Properties of Materials With Nontrivial Electronic Topology; Authors: Koushik Pal, Shashwat Anand and Umesh V. Waghmare; Date: Nov. 3, 2015.
High Thermoelectric Performance of Weyl Semimetal Taas; Authors: Bo Penga, Hao Zhanga, Hezhu Shaob, Hongliang Luc, David Wei Zhangc, Heyuan Zhua; Date: Dec. 2016.

* cited by examiner

*Primary Examiner* — Susan D Leong
*Assistant Examiner* — Dujuan A Horton
(74) *Attorney, Agent, or Firm* — Harrington & Smith

(57) ABSTRACT

Embodiments are notably directed to a thermoelectric device including a thermoelectric element. The thermoelectric element includes a Weyl semimetal and a plurality of magnetized elements. The plurality of magnetized elements are configured to apply a directed magnetic field on the Weyl-semimetal. Embodiments further concern a related method for cooling a device and a related method for generating electrical energy.

25 Claims, 4 Drawing Sheets

400

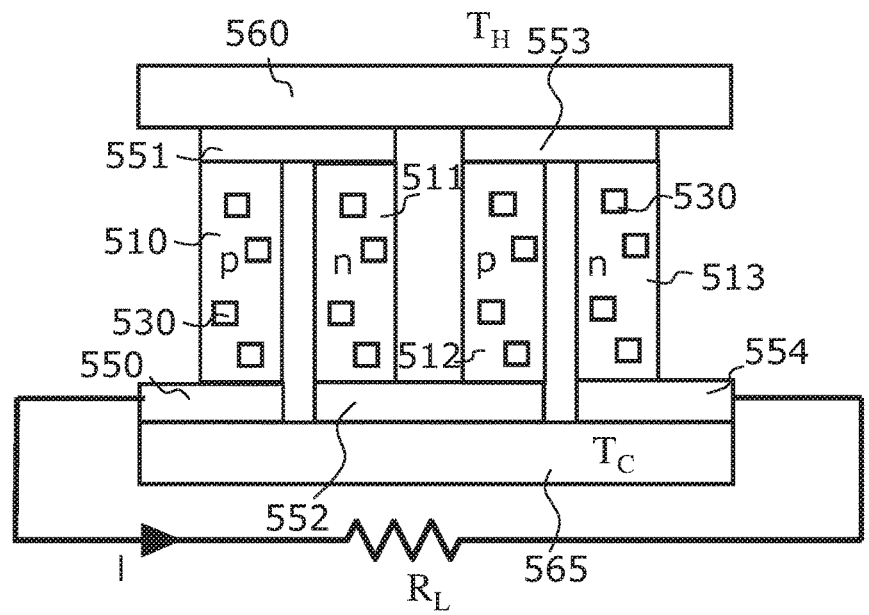
FIG. 5      500
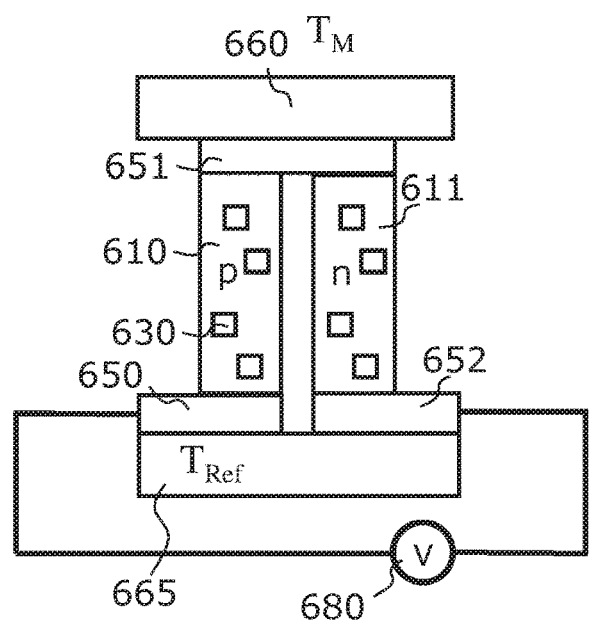
FIG. 6      600

THERMOELECTRIC DEVICE

BACKGROUND

Aspects of the present invention relate generally to thermoelectric elements, modules and devices. Further aspects relate to methods for cooling of devices by thermoelectric elements as well as methods for generating electrical energy by thermoelectric elements.

Thermoelectric devices for cooling are e.g. used to transfer excess heat from electronic devices. As many electronic devices have low power dissipation, additional cooling means are desired. Thermoelectric cooling was first discovered by John Charles Peltier who observed that a current flowing through a junction between dissimilar conductors, such as n- or p-type semiconductors, can induce heat or cooling as a function of the current flow through the junction. This effect is called the Peltier- or thermoelectric effect. The temperature can be increased or lowered depending on the current direction through the junction.

Thermoelectric devices are often used as heat pumps placed between a heat source and a heat sink. The heat source can be an electric component and the heat sink sometimes is a surface plate or a convection heat sink. Conventional thermoelectric cooling devices use multiple stages to stepwise cool down an object or transfer heat away from a heat source. Such multi-stage modules mainly consist of separate thermoelectric modules stacked on top of each other. This leads to additional space requirements and an increase in expenditure due to the plurality and complexity of thermoelectric components involved.

Achieving high cooling power in a solid state devices remains a challenge for various applications such as quantum computing, sensing and heat management on chips.

Other applications of thermoelectric devices include the generation of electrical energy from differences in environment temperature, e.g. for the autarkic power supply of devices.

Hence it is generally desirable to increase the efficiency of thermoelectric devices.

SUMMARY

According to a first aspect, the invention is embodied as a thermoelectric device comprising a thermoelectric element. The thermoelectric element comprises a Weyl semimetal and a plurality of magnetized elements. The plurality of magnetized elements are configured to apply a directed magnetic field on the Weyl-semimetal.

Such an embodied thermoelectric device may provide an increased efficiency for cooling or energy harvesting applications of the thermoelectric device. In particular, the use of Weyl-semimetals in combination with the magnetized elements may provide thermoelectric devices with an increased ZT value as figure of merit compared with conventional thermoelectric materials such as bismuth telluride, PeTe, silicides, skutterudites or half heusler alloys. The ZT value is the product of the absolute temperature T of the heat source (hot side of the device/component to be cooled) and Z, wherein $$Z = \sigma S^2 / k,$$

wherein $\sigma$ is the electrical conductivity of the material used, S is the Seebeck coefficient and k the thermal conductivity of the material used.

An overview of the current research on Weyl semimetals is provided by Shuang Jia, Su-Yang Xu and M. Zahid Hasan Weyl in the document "Weyl semimetals, Fermi arcs and chiral anomalies", 1140 NATURE MATERIALS, VOL 15, NOVEMBER 2016. According to this document "Weyl semimetals are semimetals or metals whose quasiparticle excitation is the Weyl fermion, a particle that played a crucial role in quantum field theory, but has not been observed as a fundamental particle in vacuum. Weyl fermions have definite chiralities, either left-handed or right-handed. In a Weyl semimetal, the chirality can be understood as a topologically protected chiral charge. Weyl nodes of opposite chirality are separated in momentum space and are connected only through the crystal boundary by an exotic non-closed surface state, the Fermi arcs. Weyl fermions are robust while carrying currents, giving rise to exceptionally high mobilities. Their spins are locked to their momentum directions, owing to their character of momentum-space magnetic monopole configuration. Because of the chiral anomaly, the presence of parallel electric and magnetic fields can break the apparent conservation of the chiral charge, making a Weyl metal, unlike ordinary nonmagnetic metals, more conductive with an increasing magnetic field."

According to an embodiment, the Weyl semimetal is configured to guide a thermal heat flux and an electrical current. Furthermore, the directed magnetic field is directed in a direction parallel to the electrical current. Hence the electrical current and the magnetic field applied by the magnetized elements are parallel to each other. Such an embodied thermoelectric device may break the conservation of the chiral charge caused by the chiral anomaly. As a result, the conductivity of thermoelectric elements according to embodiments of the invention can be increased by the application of the directed magnetic field. This in return results in an increase of the ZT value.

According to an embodiment, the magnetized elements are arranged in such a way that the thermal heat flux and the electrical current mainly flow through the Weyl semimetal.

Such an embodiment is based on the finding that the electrical and thermal conductivity of the magnetized elements may be often higher than the electrical and thermal conductivity of the Weyl semimetal. Hence the electrical current as well as the thermal heat flux may bypass the Weyl semimetal and flow through the magnetized elements instead. According to this embodiment, the magnetized elements are arranged in such a way, that such a bypassing is avoided or reduced and that the thermal heat flux and the electrical current "mainly" flow through the Weyl semimetal.

According to embodiments, the term "mainly" shall mean that more than 50% of the total electrical current and the total heat flux respectively flow only through the Weyl semimetal and that hence less than 50% of the total electrical current and the total heat flux take a bypass through one of the magnetized elements. According to other embodiments, the term "mainly" shall mean that more than 60%, more than 70%, more than 80% or more than 90% of the total electrical current and the total heat flux respectively flow only through the Weyl semimetal. The magnetized elements may be designed in particular such that they have a predefined maximum contact length in the direction of the electrical current and the direction of the thermal heat. Such a predefined maximum length makes it "unattractive" for the electrical current and the thermal heat flow respectively to bypass the Weyl semimetal. According to embodiments, the maximum length is chosen such that the thermal resistance of a Weyl semimetal having the maximum length is less than two times of the thermal interface resistance between the Weyl semimetal and the magnetized elements.

According to embodiments, the magnetized elements are embodied as separate discrete elements.

According to embodiments, the magnetized elements are arranged adjacent to the Weyl semi-metal, in particular in a serial manner with predefined distances between each other. This allows for an efficient application of high magnetic fields on the Weyl-semimetal. The attachment of the magnetized elements to the Weyl-semimetal may be performed with fabrication methods known to a skilled person in the art such as e.g. gluing, metal deposition through a mask, lithography processes, and self-assembly processes.

According to other embodiments, the magnetized elements are embedded in the Weyl semi-metal. This allows for an efficient application of high magnetic fields on the Weyl-semimetal. Such Weyl-semimetals with embedded magnetized elements may be fabricated with fabrication methods known to a skilled person in the art such as e.g. doping with magnetic elements during the crystal growth of the Weyl semimetal, inclusion of magnetic nanoparticles.

According to some embodiments, the embedded magnetized elements are micro-elements having a dimension in the μm range. According to other embodiments, the embedded magnetized elements are atoms.

According to embodiments, the Weyl-semimetal may be in particular TaAs, NbP or TaP.

According to other embodiments, the Weyl-semimetal may be a Dirac metal. The Dirac metal may be in particular $Cd_2As_3$ or $Na_3Bi$. Such Dirac metals turn into a Weyl semimetal by the application of the magnetic field B.

According to other embodiments, the Weyl semimetal may be RPtBi or GdPtBi. These materials turn into a Weyl semimetal by applying the magnetic field B.

According to embodiments, the magnetized elements may be embodied as rare earth magnets.

According to embodiments, the magnetized elements may comprise materials such as neodymium-iron-boron, mangan aluminum, samarium cobalt or aluminum nickel cobalt.

According to embodiments, the thermoelectric device is a cooling device. Embodiments of the invention may provide an increased cooling power and an increased temperature difference between a heat source and a heat sink as a result of the increased ZT value.

According to embodiments, the thermoelectric device is an electrical energy source configured to convert a temperature difference between contact electrodes of the thermoelectric device into electrical energy. Such an embodied device may e.g. use solar energy to generate electricity. Such an embodied device can be e.g. used as an autarkic power supply for Internet of Things (IoT) devices.

According to embodiments, the thermoelectric device is a temperature sensor.

According to embodiments, the magnetized elements are configured to apply a magnetic field of at least 1 Tesla on the Weyl semimetal. Such a high magnetic field increases the ZT value of the thermoelectric element.

According to another aspect of the invention, a method for cooling a device is provided. The method comprises a step of providing a thermoelectric device comprising a thermoelectric element. The thermoelectric element comprises a Weyl semimetal and a plurality of magnetized elements according to embodiments of the first aspect. A further step comprises applying, by the thermoelectric device, an electrical current to the thermoelectric element. A further step comprises applying, by the plurality of magnetized elements, a directed magnetic field on the Weyl-semimetal in parallel to the direction of the electrical current. A further step comprises generating a heat flux through the thermoelectric element in response to the electrical current.

Such a method may provide an increased cooling efficiency and an increased ZT value as figure of merit compared with cooling methods that use conventional thermoelectric materials.

According to another aspect of the invention, a method for generating electrical energy is provided. The method comprises a step of providing a thermoelectric device comprising a thermoelectric element. The thermoelectric element comprises a Weyl semimetal and a plurality of magnetized elements according to embodiments of the first aspect. A further step comprises applying a thermal heat flux to the thermoelectric device, e.g. a solar heat flux. A further step comprises applying, by the plurality of magnetized elements, a directed magnetic field on the Weyl-semimetal in parallel to the thermal heat flux. A further step comprises generating an electrical current through the thermoelectric element in response to the heat flux.

Such a method may provide an increased efficiency and an increased ZT value as figure of merit compared with methods that use conventional thermoelectric materials.

Embodiments of the invention will be described in more detail below, by way of illustrative and non-limiting examples, with reference to the accompanying drawings.

BRIEF DESCRIPTION OF THE SEVERAL VIEWS OF THE DRAWINGS

FIG. 5 shows a thermoelectric device embodied as an electrical energy source;

FIG. 6 shows a thermoelectric device embodied as temperature sensor;

DETAILED DESCRIPTION

Figure 1:
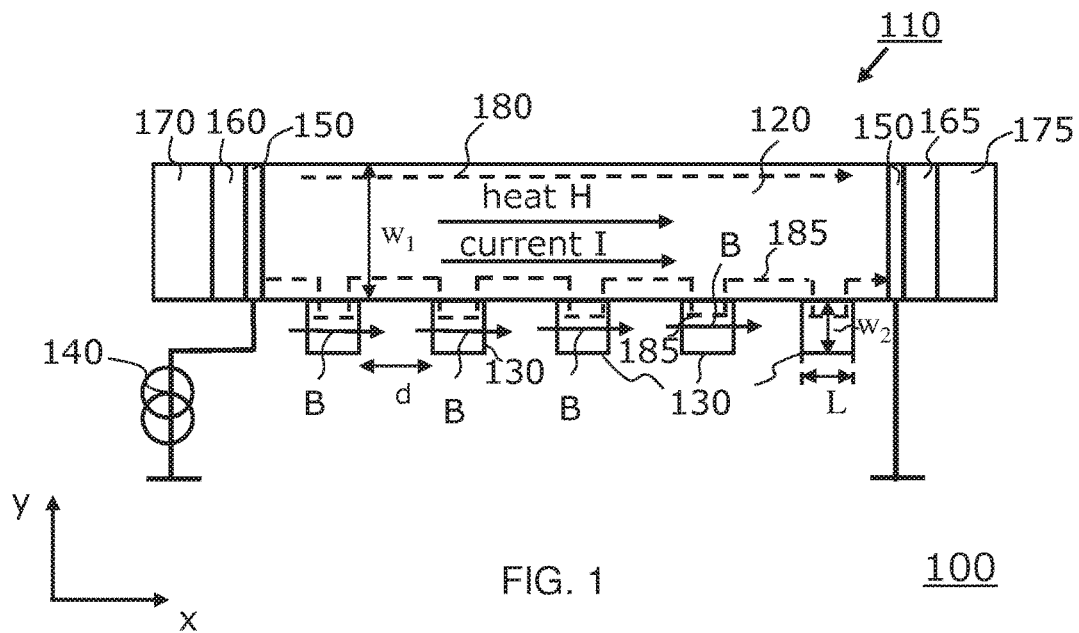
FIG. 1 shows a schematic cross sectional view of a thermoelectric device according to an embodiment of the invention with magnetized elements adjacent to a Weyl-semimetal.

FIG. 1 shows a schematic cross sectional view of a thermoelectric device 100 according to an embodiment of the invention. The thermoelectric device 100 comprises a thermoelectric element 110. The thermoelectric element 110 comprises as thermoelectric material a Weyl semimetal 120 and a plurality of magnetized elements 130. Each of the magnetized elements 130 applies a directed magnetic field B on the Weyl-semimetal 120. The magnetized elements 130 are arranged adjacent to the Weyl semimetal 120. More particularly, the magnetized elements 130 are arranged in a serial manner along a longitudinal direction x with predefined distances d between each other.

The thermoelectric device 100 further comprises a current source 140 for applying an electrical current I to the thermoelectric element 110. The electrical current I is applied to the thermoelectric element 110 via electrical contact electrodes 150. The thermoelectric device 100 further comprises thermal contacts 160 and 165, which may be embodied e.g. as ceramic plates. The thermal contact 160 may be coupled to a heat source 170 and the thermal contact 165 to a heat sink 175. The heat source 170 may be an element, object, module or device from which excess heat shall be transferred through the thermoelectric element 110 to the heat sink 175. The Weyl semimetal 120 is configured to guide a thermal heat flux H from the heat source 170 to the heat sink 175 in parallel to the electrical current I. The directed magnetic field B is directed in a direction parallel to the electrical current I and the thermal heat flux H.

The heat sink 175 may be an element, module, object or device that may dissipate or capture heat. Generally, the heat source 175 is cooled down through the thermoelectric device 100, and the heat sink 175 is heated up. The thermoelectric device 100 may be considered as a heat pump for transferring heat from the heat source 170 to the heat sink 175.

The magnetized elements 130 are arranged in such a way that the thermal heat flux H and the electrical current I mainly flow through the Weyl semimetal 120 and not through the magnetized elements 130. This is in particular achieved by providing sufficient distances d between the magnetized elements 130 and also by providing magnetized elements with a predefined maximum length L. As the electrical and thermal conductivity of the magnetized elements 130 may be often higher than the electrical and thermal conductivity of the Weyl semimetal 120, the magnetized elements 130 could generally provide a parallel path or bypass 185 for the electrical current I and the thermal heat flux H. According to this embodiment, such a bypassing is avoided or reduced by providing appropriate distances d between the magnetized elements 130 and by providing magnetized elements with a predefined maximum length L. Such a predefined maximum length L can ensure that a total thermal resistance of the bypath 185 is higher than the thermal resistance of the direct thermal path 180, in particular due to the thermal interface resistances between the Weyl semimetal 120 and the magnetized elements 130. As a result, the thermal heat flux H and the electrical current I flow mainly through the Weyl semimetal 120.

The thermoelectric device 100 employs the Peltier effect or thermoelectric effect which sometimes is also called Seebeck effect. The thermoelectric device 100 may also be denoted as Peltier cooler.

In general, the maximum temperature difference $\Delta T$ obtainable with a Peltier cooler is given by:

$$\Delta T = 0.5 Z T^2$$

where T is the absolute temperature of the heat source 170 (hot side) and Z is $$Z = \sigma S^2 / k$$

where $\sigma$ is the electrical conductivity of the material used, S is the Seebeck coefficient and k the thermal conductivity of the material used.

Typically a value of ZT of around 1 is used in devices according to the prior art.

The Weyl-semimetal 120 in combination with the magnetic field B applied by the magnetized elements 130 provides according to embodiments a ZT value as figure of merit of more than 1. According to preferred embodiments, the ZT value is higher than 2. According to even more preferred embodiments, the ZT value is higher than 3.

According to some embodiments, the Weyl-semimetal 120 may comprise TaAs, NbP or TaP.

According to other embodiments, the Weyl-semimetal may be a Dirac metal. Such a Dirac metal turns into a Weyl semimetal by the application of the magnetic field B. Such a Dirac metal may be e.g. Cd2As3 or Na3Bi.

According to other embodiments, the Weyl semimetal 120 may comprise RPtBi or GdPtBi. These materials turn also into a Weyl semimetal by applying the magnetic field B.

According to embodiments, the magnetized elements 130 may comprise rare earth magnets. According to other embodiments, the magnetized elements 130 may comprise Neodymium-iron-boron, mangan aluminum, samarium cobalt or aluminum nickel cobalt.

The thermoelectric element 110 may have in particular the form of a bar. The bar may have according to an embodiment a width $w_1$ in a y-direction in a range between 0.1 μm and 10 μm. The magnetic elements 130 may have a width $w_2$ in the y-direction in a range between 0.1 μm and 10 μm. The magnetic elements 130 may have a length L in a x-direction in a range between 0.1 μm and 10 μm. Furthermore, the magnetic elements 130 are arranged with a distance d in the x-direction between each other in a range between 0.1 μm and 10 μm. Preferably the width $w_1$, the width $w_2$, the distance d and the length L have the same or a similar magnitude. Preferably the magnitudes of the width $w_1$, the width $w_2$, the distance d and the length L are within a range of 20%.

Such dimensions may ensure that the thermal heat flux and the electrical current flow mainly through the Weyl semimetal 120.

Figure 2:
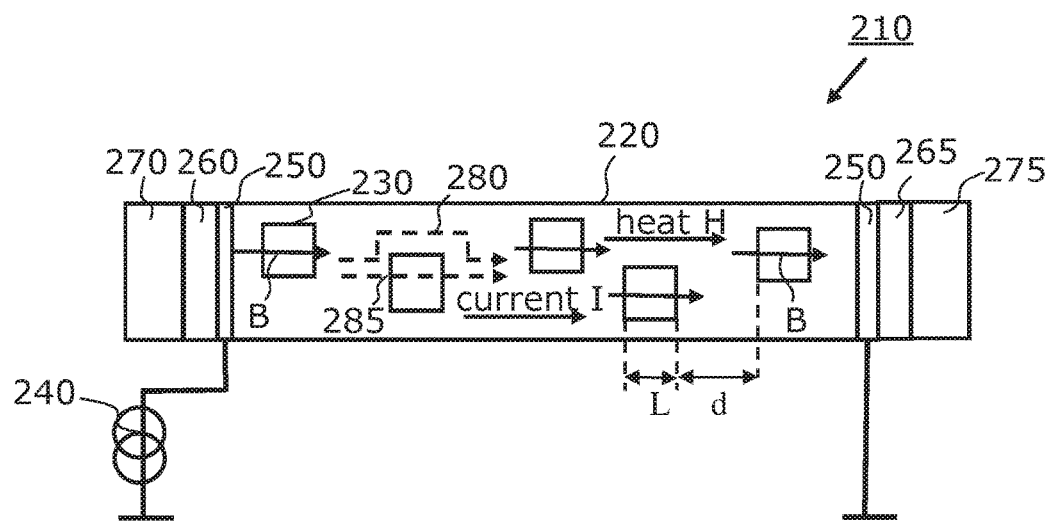
FIG. 2 shows a schematic cross sectional view of a thermoelectric device according to an embodiment of the invention with magnetized micro-elements embedded in a Weyl-semimetal.

FIG. 2 shows a schematic cross sectional view of a thermoelectric device 200 according to another embodiment of the invention. The thermoelectric device 200 comprises a thermoelectric element 210. The thermoelectric element 210 comprises as thermoelectric material a Weyl semimetal 220 and a plurality of magnetized elements 230. Each of the magnetized elements 230 applies a directed magnetic field B on the Weyl-semimetal 220. The magnetized elements 230 are embedded in the Weyl semimetal 220. More particularly, the magnetized elements 230 are micro-elements. The micro-elements 230 are arranged within the Weyl-semimetal in a distributed manner. The micro-elements comprise a plurality of atoms and/or molecules and form magnetized clusters embedded in the Weyl-semimetal 220. The thermoelectric device 200 further comprises a current source 240 for applying an electrical current I to the thermoelectric element 210. The electrical current I is applied to the thermoelectric element 210 via electrical contact electrodes 250. The thermoelectric device 200 further comprises thermal contacts 260 and 265, which may be embodied e.g. as ceramic plates. The thermal contact 260 may be coupled to a heat source 270 and the thermal contact 265 to a heat sink 275.

The Weyl semimetal 220 is configured to guide a thermal heat flux H from the heat source 270 to the heat sink 275 in parallel to the electrical current I. The directed magnetic field B is directed in a direction parallel to the electrical current I and the thermal heat flux H.

The embedded magnetized elements 230 are also arranged in such a way that the thermal heat flux H and the electrical current I mainly flow through the Weyl semimetal 220 and not through the embedded magnetized elements 230. This is achieved by providing sufficient distances d between the magnetized elements 230 and in particular by providing a predefined maximum length L of the magnetized elements 230. The predefined maximum length L can ensure that the total thermal resistance for the thermal heat flux H through the embedded magnetized elements 230 (exemplary path 285 indicated by dotted lines) is higher than the thermal resistance of the thermal path 280 (indicated also by dotted lines) around the embedded magnetized elements 230. This is in particular due to the thermal interface resistances between the Weyl semimetal 220 and the magnetized elements 230. As a result, the thermal heat flux H and the electrical current I flow mainly through the Weyl semimetal 220.

Figure 3:
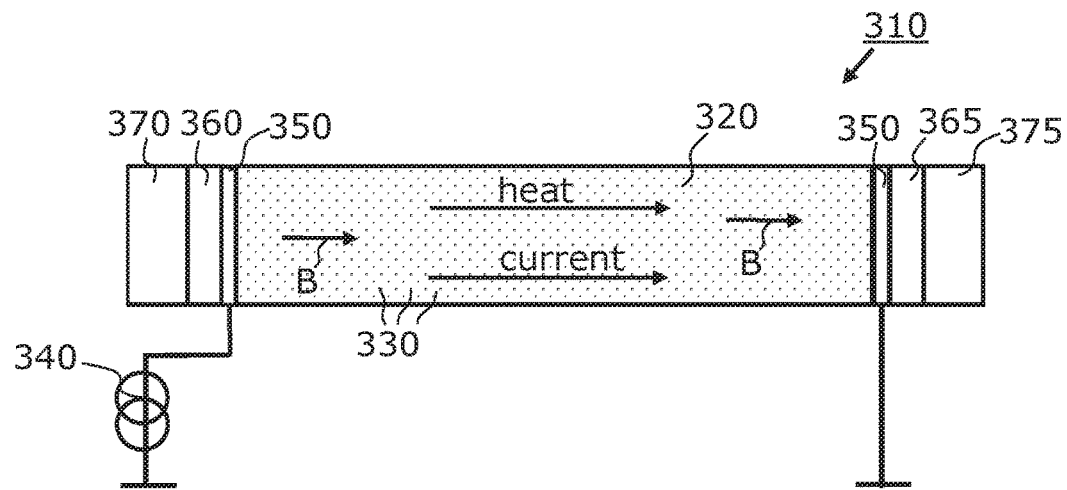
FIG. 3 shows a schematic cross sectional view of a thermoelectric device according to an embodiment of the invention with magnetized atoms embedded in a Weyl-semimetal.

FIG. 3 shows a schematic cross sectional view of a thermoelectric device 300 according to yet another embodiment of the invention. The thermoelectric device 300 comprises a thermoelectric element 310. The thermoelectric element 310 comprises as thermoelectric material a Weyl semimetal 320 and a plurality of magnetized elements 330. Each of the magnetized elements 330 applies a directed magnetic field B on the Weyl-semimetal 320. The magnetized elements 330 are embedded in the Weyl semimetal 320. More particularly, the magnetized elements 330 are atoms. The atoms are arranged within the Weyl-semimetal in a distributed manner. The thermoelectric device 300 further comprises a current source 340 for applying an electrical current I to the thermoelectric element 310. The electrical current I is applied to the thermoelectric element 310 via electrical contact electrodes 350. The thermoelectric device 300 further comprises thermal contacts 360 and 365, which may be embodied e.g. as ceramic plates. The thermal contact 360 may be coupled to a heat source 370 and the thermal contact 365 to a heat sink 375.

The Weyl semimetal 320 is configured to guide a thermal heat flux H from the heat source 370 to the heat sink 375 in parallel to the electrical current I. The directed magnetic field B is directed in a direction parallel to the electrical current I the thermal heat flux H.

Figure 4:
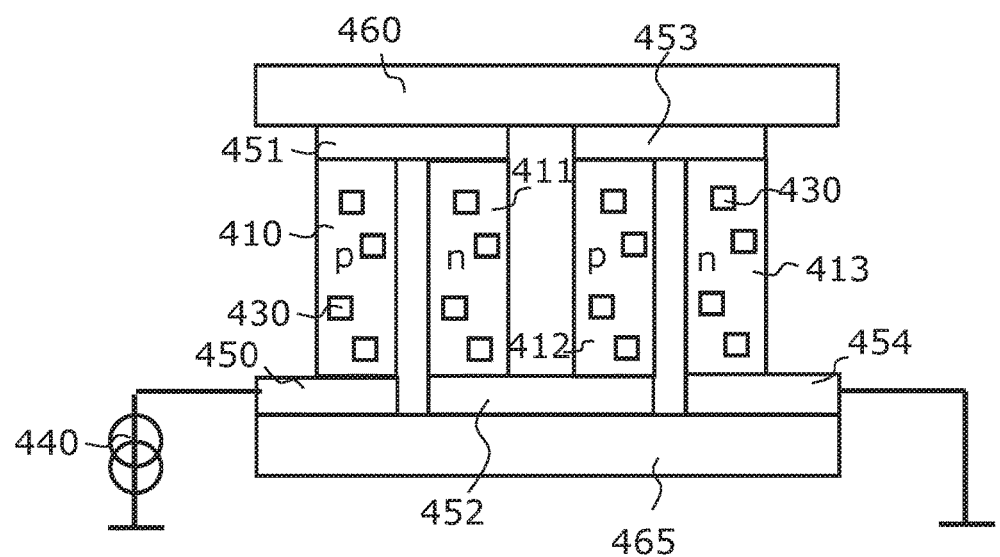
FIG. 4 shows a thermoelectric cooling device according to an embodiment of the invention.

FIG. 4 shows a thermoelectric device 400 embodied as a cooling device. The thermoelectric device 400 comprises four thermoelectric elements 410, 411, 412 and 413, which each comprise as thermoelectric material a Weyl semimetal and a plurality of magnetized elements 430. Each of the magnetized elements 430 applies a directed magnetic field B (not shown) on the Weyl-semimetal. The thermoelectric element 410 and the thermoelectric element 412 are p-doped and hence embodied as p-type Weyl-semimetal. The thermoelectric element 411 and the thermoelectric element 413 are n-doped and hence embodied as n-type Weyl-semimetal. The four thermoelectric elements 410, 411, 412 and 413 are electrically coupled in series. A contact electrode 450 contacts the thermoelectric element 410, a contact electrode 451 connects the thermoelectric elements 410 and 411, a contact electrode 452 connects the thermoelectric elements 411 and 412, a contact electrode 453 connects the thermoelectric elements 412 and 413 and a contact electrode 454 contacts the thermoelectric element 413.

The thermoelectric device 400 further comprises a current source 440 for applying an electrical current I in series through to the thermoelectric elements 410-413.

The thermoelectric device 400 further comprises thermal contacts 460 and 465, which may be embodied e.g. as ceramic plates. The thermal contact 460 may be coupled to a heat source (not shown) and the thermal contact 465 to a heat sink (not shown).

FIG. 5 shows a thermoelectric device 500 embodied as an electrical energy source. The thermoelectric device 500 converts a temperature difference between a hot side of the device 500 having a temperature $T_H$ and a cold side of the device having a temperature $T_C$ into electrical energy.

More particularly, the thermoelectric device 500 comprises four thermoelectric elements 510, 511, 512 and 513, which each comprise as thermoelectric material a Weyl semimetal and a plurality of magnetized elements 530. Each of the magnetized elements 530 applies a directed magnetic field B (not shown) on the Weyl-semimetal. The thermoelectric element 510 and the thermoelectric element 512 are p-doped and hence embodied as p-type Weyl-semimetal. The thermoelectric element 511 and the thermoelectric element 513 are n-doped and hence embodied as n-type Weyl-semimetal. The four thermoelectric elements 510, 511, 512 and 513 are electrically coupled in series. A contact electrode 550 contacts the thermoelectric element 510, a contact electrode 551 connects the thermoelectric elements 510 and 511, a contact electrode 552 connects the thermoelectric elements 511 and 512, a contact electrode 553 connects the thermoelectric elements 512 and 513 and a contact electrode 554 contacts the thermoelectric element 513. The contact electrodes 550 and 554 are electrically connected to a load resistance $R_L$.

The thermoelectric device 500 further comprises thermal contacts 560 and 565, which may be embodied e.g. as ceramic plates. The thermal contact 560 is configured to receive heat, e.g. solar thermal heat, and the device 500 converts this thermal heat into an electrical current I and hence into electrical energy at the load resistance $R_L$.

FIG. 6 shows a thermoelectric device 600 embodied as temperature sensor.

More particularly, the thermoelectric device 600 comprises two thermoelectric elements 610 and 611, which each comprise as thermoelectric material a Weyl semimetal and a plurality of magnetized elements 630. Each of the magnetized elements 630 applies a directed magnetic field B (not shown) on the Weyl-semimetal. The thermoelectric element 610 is p-doped and hence embodied as p-type Weyl-semimetal. The thermoelectric element 611 is n-doped and hence embodied as n-type Weyl-semimetal. The two thermoelectric elements 610 and 611 are electrically coupled in series. A contact electrode 650 contacts the thermoelectric element 610, a contact electrode 651 connects the thermoelectric elements 610 and 611 and a contact electrode 652 contacts the thermoelectric element 611. The contact electrodes 650 and 652 are electrically connected to a voltmeter 680.

The thermoelectric device 600 further comprises thermal contacts 660 and 665, which may be embodied e.g. as ceramic plates. The thermal contact 665 is operated at a fixed reference temperature $T_{REF}$, while the device 600 is configured to measure a temperature $T_M$ at the side of the thermal contact 660. More particularly, the measured voltage at the voltmeter 680 is converted into a temperature difference with respect to the reference temperature $T_{Ref}$.

Figure 7:
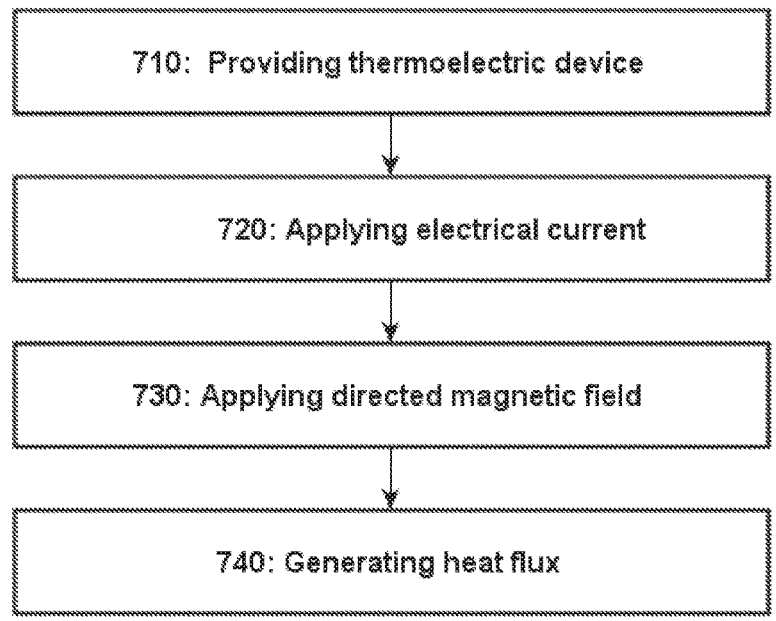
FIG. 7 shows a flow chart of method steps of a method for cooling a device.

FIG. 7 illustrates method steps of a method 700 for cooling a device.

At a step 710, a thermoelectric device comprising a thermoelectric element is provided. The thermoelectric element comprises a Weyl semimetal and a plurality of magnetized elements and may be embodied as described above At a step 720, the thermoelectric device applies an electrical current to the thermoelectric element by means of a current source.

At a step 730, the plurality of magnetized elements apply a directed magnetic field on the Weyl-semimetal in parallel to the direction of the electrical current.

At a step 740, the thermoelectric device generates a heat flux through the thermoelectric element in response to the electrical current.

The method 700 provides advantages in terms of cooling efficiency by using a Weyl semimetal as thermoelectric material in combination with the application of a directed magnetic field.

Figure 8:
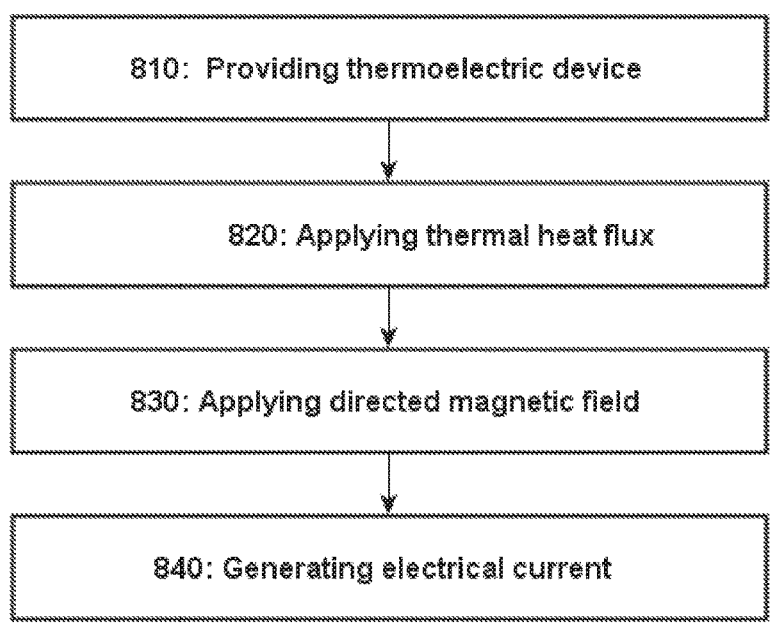
FIG. 8 shows a flow chart of method steps of a method for generating electrical energy.

FIG. 8 illustrates method steps of a method 800 for for generating electrical energy.

At a step 810, a thermoelectric device comprising a thermoelectric element is provided. The thermoelectric element comprises a Weyl semimetal and a plurality of magnetized elements and may be embodied as described above At a step 820, a thermal heat flux is provided to the thermoelectric device, e.g. in the form of thermal solar heat.

At a step 830, the plurality of magnetized elements apply a directed magnetic field on the Weyl-semimetal in parallel to the thermal heat flux.

At a step 840, the thermoelectric device generates an electrical current through the thermoelectric element in response to the heat flux.

The method 800 provides advantages in terms of efficient energy harvesting by using a Weyl semimetal as thermoelectric material in combination with the application of a directed magnetic field.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A thermoelectric device comprising a thermoelectric element, the thermoelectric element comprising a Weyl semimetal and a plurality of magnetized elements, the plurality of magnetized elements being configured to apply a directed magnetic field on the Weyl-semimetal.

2. A thermoelectric device according to claim 1, wherein
the Weyl semimetal is configured to guide a thermal heat flux and an electrical current; and
the directed magnetic field is directed in a direction parallel to the electrical current.

3. A thermoelectric device according to claim 2, wherein the magnetized elements are arranged in such a way that
the thermal heat flux and the electrical current mainly flow through the Weyl semimetal.

4. A thermoelectric device according to claim 1, wherein the magnetized elements are arranged adjacent to the Weyl semimetal.

5. A thermoelectric device according to claim 4, wherein the magnetized elements are arranged in a serial manner with predefined distances between each other.

6. A thermoelectric device according to claim 1, wherein the magnetized elements are embedded in the Weyl semimetal.

7. A thermoelectric device according to claim 6, wherein the magnetized elements are micro-elements.

8. A thermoelectric device according to claim 6, wherein the magnetized elements are atoms.

9. A thermoelectric device according to claim 1, wherein the Weyl-semimetal is selected from the group consisting of: TaAs, NbP and TaP.

10. A thermoelectric device according to claim 1, wherein the Weyl-semimetal is a Dirac metal.

11. A thermoelectric device according to claim 10, wherein the Dirac metal is selected from the group consisting of: $Cd_2As_3$ and $Na_3Bi$.

12. A thermoelectric device according to claim 1, wherein the Weyl semimetal is selected from the group consisting of: RPtBi and GdPtBi.

13. A thermoelectric device according to claim 1, wherein the magnetized elements comprise rare earth magnets.

14. A thermoelectric device according to claim 1, wherein the magnetized elements are selected from the group consisting of: Neodymium-iron-boron, mangan aluminum, samarium cobalt or aluminum nickel cobalt.

15. A thermoelectric device according to claim 1, wherein the thermoelectric device is a cooling device.

16. A thermoelectric device according to claim 1, wherein the thermoelectric device is an electrical energy source configured to convert a temperature difference between contact electrodes of the thermoelectric device into electrical energy.

17. A thermoelectric device according to claim 1, wherein the thermoelectric device is a temperature sensor.

18. A thermoelectric device according to claim 1, wherein the magnetized elements are configured to apply a magnetic field of at least 1 Tesla on the Weyl semimetal.

19. A thermoelectric device according to claim 1, wherein
the thermoelectric element is arranged between contact electrodes;
the thermoelectric element is configured to lead an electric current between the contact electrodes.

20. A thermoelectric device according to claim 1, wherein
the thermoelectric element has the form of a rod;
the rod has a width in a range between 0.1 µm and 10 µm;
the magnetic elements have a width in a range between 0.1 µm and 10 µm;
the magnetic elements have a length in a range between 0.1 µm and 10 µm; and
the magnetic elements are arranged with a distance d between each other, the distance d being in a range between 0.1 µm and 10 µm.

21. A method for cooling a device, the method comprising:
providing a thermoelectric device comprising a thermoelectric element, the thermoelectric element comprising a Weyl semimetal and a plurality of magnetized elements;
applying, by the thermoelectric device, an electrical current to the thermoelectric element;
applying, by the plurality of magnetized elements, a directed magnetic field on the Weyl-semimetal, the directed magnetic field being applied in parallel to the direction of the electrical current; and
generating a heat flux through the thermoelectric element in response to the electrical current.

22. A method according to claim 21, wherein the magnetized elements are arranged adjacent to the Weyl semimetal.

23. A method according to claim 21, wherein the magnetized elements are embedded in the Weyl semimetal.

24. A method for generating electrical energy, the method comprising:

providing a thermoelectric device comprising a thermoelectric element, the thermoelectric element comprising a Weyl semimetal and a plurality of magnetized elements;

applying a thermal heat flux to the thermoelectric device;

applying, by the plurality of magnetized elements, a directed magnetic field on the Weyl-semimetal, the directed magnetic field being applied in parallel to the thermal heat flux; and generating an electrical current through the thermoelectric element in response to the heat flux.

25. A method according to claim 24, wherein the magnetized elements are arranged adjacent to the Weyl semimetal or embedded in the Weyl semimetal.

\* \* \* \* \*